United States Patent
Zhu et al.

(10) Patent No.: US 7,863,172 B2
(45) Date of Patent: Jan. 4, 2011

(54) GALLIUM NITRIDE SEMICONDUCTOR DEVICE

(75) Inventors: TingGang Zhu, Somerset, NJ (US); Bryan S. Shelton, Bound Brook, NJ (US); Marek K. Pabisz, Quakertown, PA (US); Mark Gottfried, Hillsborough, NJ (US); Linlin Liu, Hillsborough, NJ (US); Milan Pophristic, Princeton, NJ (US); Michael Murphy, Somerset, NJ (US); Richard A. Stall, Belle Mead, NJ (US)

(73) Assignee: Power Integrations, Inc., San Jose, CA (US)

( * ) Notice: Subject to any disclaimer, the term of this patent is extended or adjusted under 35 U.S.C. 154(b) by 88 days.

(21) Appl. No.: 12/249,099

(22) Filed: Oct. 10, 2008

(65) Prior Publication Data

US 2009/0035925 A1 Feb. 5, 2009

Related U.S. Application Data

(62) Division of application No. 11/030,554, filed on Jan. 6, 2005, now Pat. No. 7,436,039.

(51) Int. Cl.
*H01L 29/872* (2006.01)
*H01L 29/47* (2006.01)

(52) U.S. Cl. ............... 438/534; 438/570; 438/92; 257/E21.368; 257/E21.359; 257/E21.351

(58) Field of Classification Search .......... 438/534, 438/570, 92; 257/E21.473, E21.368, E21.359, 257/E21.351

See application file for complete search history.

(56) References Cited

U.S. PATENT DOCUMENTS

| 3,775,200 | A | 11/1973 | De Nobel et al. |
| 4,543,595 | A | 9/1985 | Vora |
| 4,745,445 | A | 5/1988 | Mun et al. |

(Continued)

FOREIGN PATENT DOCUMENTS

EP 0081414 6/1983

(Continued)

OTHER PUBLICATIONS

European Search Report for EP 06250065, dated Apr. 17, 2008.

(Continued)

*Primary Examiner*—Ngan Ngo
*Assistant Examiner*—Benjamin Tzu-Hung Liu
(74) *Attorney, Agent, or Firm*—The Law Offices of Bradley J. Bereznak

(57) ABSTRACT

A gallium nitride based semiconductor Schottky diode fabricated from a n+ doped GaN layer having a thickness between one and six microns disposed on a sapphire substrate; an n– doped GaN layer having a thickness greater than one micron disposed on said n+ GaN layer patterned into a plurality of elongated fingers and a metal layer disposed on the n– doped GaN layer and forming a Schottky junction therewith. The layer thicknesses and the length and width of the elongated fingers are optimized to achieve a device with breakdown voltage of greater than 500 volts, current capacity in excess of one ampere, and a forward voltage of less than three volts.

18 Claims, 16 Drawing Sheets

U.S. PATENT DOCUMENTS

| | | | |
|---|---|---|---|
| 4,946,547 A | 8/1990 | Palmour et al. | |
| 5,200,022 A | 4/1993 | Kong et al. | |
| RE34,861 E | 2/1995 | Davis et al. | |
| 5,602,418 A | 2/1997 | Imai et al. | |
| 5,612,567 A | 3/1997 | Baliga | |
| 5,686,738 A | 11/1997 | Moustakas | |
| 5,741,724 A | 4/1998 | Ramdani et al. | |
| 5,785,606 A | 7/1998 | Marquez | |
| 5,874,747 A | 2/1999 | Redwing et al. | |
| 5,877,558 A | 3/1999 | Nakamura et al. | |
| 6,121,121 A | 9/2000 | Koide | |
| 6,139,628 A | 10/2000 | Yuri et al. | |
| 6,146,457 A | 11/2000 | Solomon | |
| 6,184,570 B1 | 2/2001 | MacDonald, Jr. et al. | |
| 6,239,033 B1 * | 5/2001 | Kawai | 438/693 |
| 6,331,450 B1 | 12/2001 | Uemura | |
| 6,344,665 B1 | 2/2002 | Sung et al. | |
| 6,380,108 B1 | 4/2002 | Linthicum et al. | |
| 6,389,051 B1 | 5/2002 | Van de Walle | |
| 6,437,374 B1 | 8/2002 | Northrup et al. | |
| 6,507,041 B2 | 1/2003 | Nakamura et al. | |
| 6,524,900 B2 | 2/2003 | Dahlqvist et al. | |
| 6,573,537 B1 | 6/2003 | Steigerwald et al. | |
| 6,586,777 B1 | 7/2003 | Yuasa et al. | |
| 6,586,781 B2 | 7/2003 | Wu et al. | |
| 6,593,597 B2 | 7/2003 | Sheu | |
| 6,605,854 B2 | 8/2003 | Nagase et al. | |
| 6,608,327 B1 | 8/2003 | Davis et al. | |
| 6,610,995 B2 | 8/2003 | Nakamura et al. | |
| 6,624,444 B1 | 9/2003 | Li | |
| 6,627,967 B2 | 9/2003 | Asano et al. | |
| 6,649,995 B2 | 11/2003 | Tooi et al. | |
| 6,656,823 B2 | 12/2003 | Lee et al. | |
| 6,768,146 B2 | 7/2004 | Yoshida | |
| 6,855,970 B2 | 2/2005 | Hatakeyama et al. | |
| 6,949,401 B2 * | 9/2005 | Kaminski et al. | 438/92 |
| 6,949,774 B2 | 9/2005 | Parikh et al. | |
| 7,115,896 B2 | 10/2006 | Gao et al. | |
| 7,229,866 B2 | 6/2007 | Zhu et al. | |
| 7,253,015 B2 | 8/2007 | Pophristic et al. | |
| 7,323,402 B2 | 1/2008 | Chiola | |
| 2003/0015708 A1 | 1/2003 | Parikh et al. | |
| 2003/0098462 A1 * | 5/2003 | Yoshida | 257/183 |
| 2004/0119063 A1 * | 6/2004 | Guo et al. | 257/13 |
| 2006/0151868 A1 | 7/2006 | Zhu et al. | |

FOREIGN PATENT DOCUMENTS

| | | |
|---|---|---|
| EP | 0514018 | 11/1992 |
| FR | 2844099 | 3/2004 |
| JP | 11040847 | 2/1999 |
| JP | 11145514 | 5/1999 |
| WO | 96/41906 | 12/1996 |
| WO | 01/43174 | 6/2001 |

OTHER PUBLICATIONS

Hunter, L.P., "Physics of Semiconductor Materials, Devices, and Circuits Handbook of Semiconductor Electronics," pp. 1-10 (1970).

Sugimura et al.. "I-V Characteristics of Schottky/Metal-Insulator-Semiconductor Diodes with Tunnel Thin Barriers," Jpn. J. Appl. Phys. vol. 39, Part 1, No. 7B, pp. 4521-4522 (Jul. 2000).

Yanagihara, et al., "Development of GaN-Based Electronic Device on Si," Sanken Technical Report, vol. 35, No. 1 pp. 11-14 (2003). (English—language translation of Japanese—language publication).

Zhu, T.G. et al., "High-Voltage Mesa Structure GaN Schottky Rectifiers Processed by Dry and Wet Etching," Applied Physics Letters, AIP, American Institute of Physics, Melville, NY, vol. 77, No. 18 (Oct. 30, 2000).

Zhang et al., "Comparison of GaN P-I-N and Schottky Rectifier Performance," IEEE Trans. On Electronic Devices, vol. 4 No. 3, pp. 407-411 (Mar. 2001).

* cited by examiner

GALLIUM NITRIDE SEMICONDUCTOR DEVICE

REFERENCE TO RELATED APPLICATIONS

This application is a divisional of U.S. patent application Ser. No. 11/030,554 filed Jan. 6, 2005, the entire disclosure of which is incorporated herein by reference. This application is related to U.S. patent application Ser. No. 10/780,363, filed Feb. 17, 2004, assigned to the common assignee, which is hereby incorporated by reference.

BACKGROUND OF THE INVENTION

1. Field of the Invention

This invention relates to gallium nitride semiconductor devices, and more particularly to gallium nitride (GaN) Schottky diodes having improved reverse breakdown voltage and current capacity for high power applications.

2. Description of the Related Art

Diode rectifiers are one of the most widely used devices for low voltage switching, power supplies, power converters and related applications. For efficient operation it is desirable for diodes to have low on-state voltage (0.1-0.2V or lower), low reverse leakage current, high blocking voltage (20-30V), and high switching speed.

The most common diodes are p-n junction diodes on made on a silicon (Si) substrate with impurity elements introduced to modify, in a controlled manner, the diodes's operating characteristics. In addition to silicon, p-n junction diodes can also be formed on wafers of other semiconductor materials such as gallium arsenide (GaAs) and silicon carbide (SiC). One disadvantage of p-n junction diodes is that during forward conduction the power loss in the diode can become excessive for large current flow.

Another type of diode is the Schottky barrier diodes, which are formed from a rectifying metal-to-semiconductor barrier area instead of a p-n junction. When the metal contacts the semiconductor, a barrier region is developed at the junction between the two. When properly fabricated the barrier region will minimize charge storage effects and improve the diodes switching by shortening the turn-off time. [L. P. Hunter, Physics of Semiconductor Materials, Devices, and Circuits, Semiconductor Devices, Page 1-10 (1970)] Common Schottky diodes have a lower turn-on voltage (approximately 0.5V or more depending on the semiconductor band gap) than pn-junction diodes and are more desirable in applications where the energy losses in the diodes can have a significant system impact (such as output rectifiers in switching power supplies).

The application of gallium nitride semiconductor devices for use in power conversion applications have presented new design and environmental requirements for such devices, as well as manufacturing and reliability considerations that have not been satisfied by prior art gallium nitride based devices.

Prior to the present invention, there has not been a commercially acceptable high power gallium nitride Schottky diode device.

SUMMARY OF THE INVENTION

Objects of the Invention

It is an object of the present invention to provide an improved high power semiconductor device.

It is another object of the invention to provide a gallium nitride Schottky diode semiconductor device.

It is another object of the present invention to provide a mesa configuration in a semiconductor device structure for improved reliability and low manufacturing cost.

It is still another object of the invention to provide an improved method for manufacturing a gallium nitride semiconductor device using a sapphire substrate and flip-chip technology. Further details are disclosed in U.S. patent application Ser. No. 11/032,666 filed Jan. 10, 2005, titled "PACKAGE FOR GALLIUM NITRIDE SEMICONDUCTOR DEVICES" filed concurrently herewith.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

Briefly, and in general terms, the present invention provides a gallium nitride based semiconductor diode with a n+ doped GaN layer having a thickness between one and six microns disposed on a substrate; an n– doped GaN layer having a thickness greater than one micron disposed on the n+ GaN layer; and a metal layer disposed on said n– doped GaN layer and forming a Schottky junction therewith.

In another aspect, the present invention provides a Schottky diode semiconductor device with a gallium nitride semiconductor structure disposed on a substrate and having a top surface, the structure including a lower semiconductor layer of a first conductivity type, an upper semiconductor layer of a first conductivity type disposed over a portion of the lower semiconductor layer and forming a plurality of mesas; and a first metal layer disposed over the upper semiconductor layer and forming a plurality of mesas; and a first metal layer disposed over the upper semiconductor layer and forming a Schottky junction on each of the plurality of mesas projecting upwardly from the lower semiconductor layer surface.

More particularly, the thickness of the lower and upper semiconductor layers are selected such that the diode has a reverse breakdown voltage of greater than 500 volts and a current capacity in excess of five amperes.

The novel features which are considered as characteristic of the invention are set forth in particular in the appended claims. The invention itself, however, both as to its construction and its method of operation, together with additional objects and advantages thereof, best will be understood from the following description of specific embodiments when read in connection with the accompanying drawings.

BRIEF DESCRIPTION OF THE DRAWING

These and other features and advantages of this invention will be better understood and more fully appreciated by reference to the following detailed description when considered in conjunction with the accompanying drawings, wherein.

DESCRIPTION OF THE PREFERRED EMBODIMENT

Figure 1A:
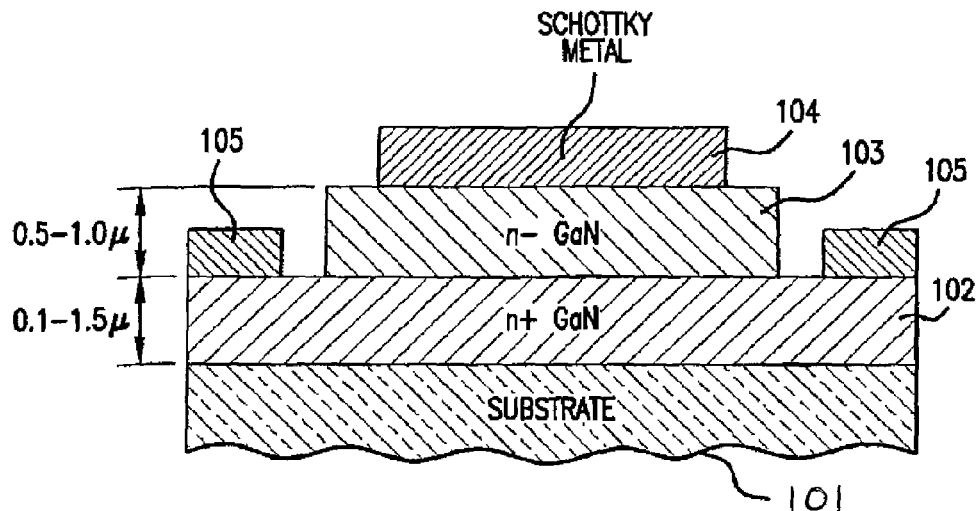
FIG. 1A is a highly simplified cross-sectional view of a GaN diode as known in the prior art in a first embodiment.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are not drawn to scale.

FIG. 1A shows a Schottky diode 100 constructed in accordance with the prior art as represented in published U.S. Patent Application 2003/0062525, formed of the Group III nitride based material system or other material systems where the Fermi level is not pinned at its surface states. Group III nitrides refer to those semiconductor compounds formed between nitrogen and the elements in Group III of the periodic table, usually aluminum (Al), gallium (Ga), and indium (In). The term also refers to ternary and tertiary compounds such as AlGaN and AlInGaN. The preferred materials for the prior art diode were GaN and AlGaN.

The diode 100 comprises a substrate 101 that can be either sapphire ($Al_2O_3$), silicon (Si) or silicon carbide (SiC), with preferred substrate in the prior art being a 4H polytype of silicon carbide. Other silicon carbide polytypes can also be used including 3C, 6H and 15R polytypes. An $AlGa_{0-x}N$ buffer layer (where x in between 0 and 1) is included on the substrate 101 and provides an appropriate crystal structure transition between the silicon carbide substrate and the remainder of the diode 100.

Silicon carbide was preferred in the prior art since it has a much closer crystal lattice match to Group III nitrides than sapphire and results in Group III nitride films of higher quality. Silicon carbide also has a very high thermal conductivity so that the total output power of Group III nitride devices on silicon carbides is not limited by the thermal dissipation of the substrate (as is the case with some devices formed on sapphire). Such prior art devices relied on lateral conduction (i.e. parallel to the surface of the chip) to form the diode. With such structure, silicon carbide substrates provides the capacity for device isolation and reduced parasitic capacitance that make commercial devices with SiC possible. SiC substrates are commercially available from Cree Research, Inc., of Durham, N.C. and methods for producing them are set forth in the scientific literature as well as in a U.S. Pat. Nos. Re. 34,861; 4,946,547; and 5,200,022.

The diode 100 has an n+ GaN layer 102 on a substrate 101 and an n− GaN layer 103 on the n+ GaN layer 102. The n+ GaN layer 102 is highly doped with impurities to a concentration of at least $10^{18}$ per centimeter cubed ($cm^3$), with the preferable concentration being 5 to 20 times this amount. The n− GaN layer 103 has a lower doping concentration but is still n-type and it preferably has an impurity concentration in the range of $5 \times 10^{14}$ to $5 \times 10^{17}$ per $cm^3$. The n− GaN layer 103 is preferably 0.5-1.0 micron thick and the n+ GaN layer 102 is 0.1 to 1.5 microns thick, although other thicknesses will also work.

Portions of the n− GaN layer 103 are etched down to the n+ GaN layer and ohmic metal contacts 105 are included on the n+ GaN layer in the etched areas so that they are electrically isolated from the n– GaN layer 103. In an alternative embodiment, one or more ohmic contacts can be included on the surface of the substrate that is not covered by the n+ GaN layer 102. This prior art embodiment is particularly applicable to substrates that are n-type. A Schottky metal layer 104 is included on the n– GaN layer 103, opposite the n+ GaN layer 102.

Figure 1B:
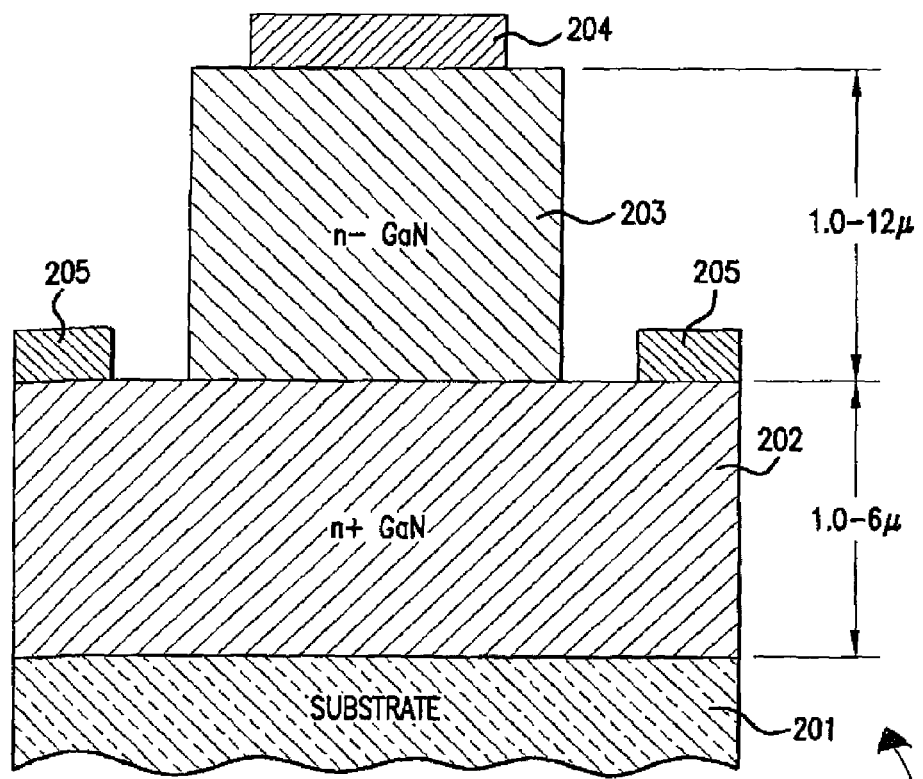
FIG. 1B is highly simplified cross-sectional view of a GaN diode according to the present invention.

FIG. 1B shows a highly enlarged view of a Schottky diode 200 constructed in accordance with a first embodiment of the present invention formed of the Group III nitride based material system. Group III nitrides refer to those semiconductor compounds formed between nitrogen and the elements in group III of the periodic table, usually aluminum (Al), gallium (Ga), and indium (In). The term also refers to ternary and tertiary compounds such as AlGaN and AlInGaN. The preferred materials for the new diode are GaN and AlGaN.

Unlike the prior art device shown in FIG. 1A, the diode 200 according to the present invention utilizes a substrate 201 that is preferably sapphire ($Al_2O_3$) due to its reduced cost and wide availability in many different diameters. Alternatively, a silicon substrate may be used.

The use of an insulating or sapphire substrate for semiconductor devices has generally relied on relatively thick sapphire substrates, such as 15 to 25 mils depending on diameter, which are commercially available. There is a thermal build-up problem with a GaN Schottky diode using commercially available, thick sapphire substrates when high currents are passed through the device. One of the key features of the present invention is that the diode 200 is implemented on a relatively thin sapphire substrate 201. By thinning the substrate after the fabrication process, normal fabrication processes can be used, but the final packaged device will have its thermal resistance reduced substantially.

Sapphire is the most common substrate for a nitride-based device. Due to the high thermal resistance of sapphire, a thick substrate is not desirable for high current density operation in the application of a GaN Schottky diode. A GaN Schottky diode requires at least one ampere of current conduction (with a corresponding current density of 400 $A/cm^2$) in the forward conduction mode. Typically, current conduction can be as high as eight to sixteen amperes with a larger device. If the heat generated during the forward current conduction cannot be quickly dissipated, the heat will increase the device temperature. Since most semiconductor material properties, such as carrier mobility, are the function of the temperature, the increased temperature will cause a severe degradation of the device performance. To reduce the thermal effects on the device performance, improving the heat conduction is necessary. Reducing the thickness of poor thermal conducting sapphire will help to improve heat conduction from the GaN Schottky diode. Experimental studies have been conducted on thinning sapphire to improve the device thermal performance. By using a conventional wafer grinding system like the model 7AA Automatic Wafer Backgrinding Machine from Strasbaugh, Inc., or a diamond grit lapping system such as the model LP50 Auto Precision Lapping and Polishing Machine from Logitech Ltd., one can thin one sapphire wafer that is 15 to 25 mil down to 6 mil in about five minutes or two hours, respectively. Some polishing may also be done to ensure the stress built up by the thick GaN epitaxial layer is relieved and does not cause the wafer to crack before the devices are singulated. The thermal resistance of the GaN diode on thick sapphire (15-17 mil) is about 5.6.degree. C./W, while on thin sapphire (6 mil) is below 2.degree. C./W. Such a large reduction in thermal resistance by thinning the sapphire greatly improves the device performance in the forward conduction mode.

Silicon carbide was preferred in the prior art since it has a much closer crystal lattice match to Group III nitrides than sapphire and results in Group III nitride films of higher quality. Silicon carbide also has a very high thermal conductivity so that the total output power of Group III nitride devices on silicon carbides is not limited by the thermal dissipation of the substrate (as is the case with some devices formed on sapphire). However, a GaN Schottky diode on thinned sapphire has substantially the same thermal properties as SiC.

The diode 200 has an n+ GaN layer 202 on the substrate 201 and an n– GaN layer 203 on the n+ GaN layer 202. The n+ GaN layer 202 is highly doped with impurities to a concentration of at least $10^{18}$ per centimeter cubed ($cm^{-3}$), with the preferable concentration being 4 to 20 times this amount. The n– GaN layer 203 has a lower doping concentration but is still n– type and it preferably has an impurity concentration in the range of $5 \times 10^{14}$ to $5 \times 10^{17}$ per $cm^3$. The n+ GaN layer 202 is preferably 1.0 to 6.0 micron thick and the n– GaN layer 203 is preferably 1.0 to 12.0 microns thick, in contrast to the relatively thin corresponding layers in the prior art as represented by FIG. 1A.

Portions of the n– GaN layer 203 are etched down to the n+ layer and ohmic metal contacts 205 are provided on the n+ GaN layer in the etched areas so that they are electrically isolated from the n– GaN layer 203. In an alternative embodiment, one or more ohmic contacts can be included on the surface of the substrate that is not covered by the n+ GaN layer 102. This prior art embodiment is particularly applicable to conducting substrates. A Schottky metal layer 204 is deposited on the top surface of the n– GaN layer 203, opposite the n+ GaN layer 202.

Figure 2A:
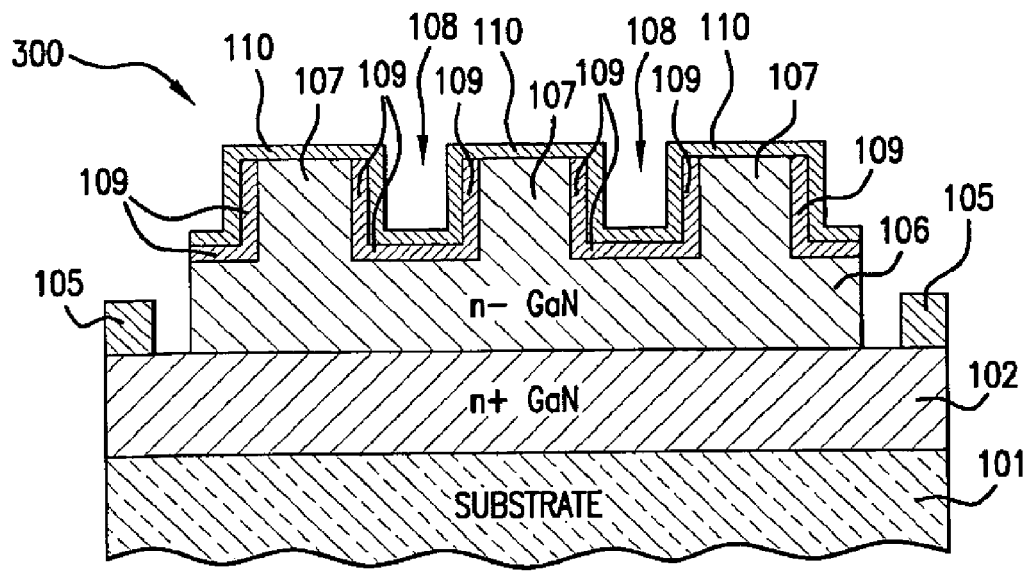
FIG. 2A is a highly simplified cross-sectional view of a GaN diode as known in the prior art in a second embodiment.

FIG. 2A is a highly simplified cross-sectional view of a GaN diode as known in the prior art in another embodiment as represented in the above noted U.S. Patent Application 2003/0062525. In particular, the Figure shows an embodiment of the Schottky diode 300 that addresses the problem of increased reverse current with decreased barrier height. The diode 300 is similar to the above embodiment having a similar substrate 101, n+ GaN layer 102, and ohmic metal contacts 105 that can alternatively be included on the surface of the substrate. It also has an n– GaN layer 106, but instead of this layer 106 being planar, it has a two dimensional trench structure that includes trenches 108 in the n– GaN layer 106. The trenches are parallel and equally spaced with mesa regions 107 remaining between adjacent trenches 108. Each trench 108 has an insulating layer 109 covering its sidewalls and bottom surface. Many different insulating materials can be used with the preferred material being silicon nitride (SiN). A Schottky metal layer 110 is included over the entire trench structure, sandwiching the insulating layer 109 between the Schottky metal 110 and the trench sidewalls and bottom surface, and covering the mesa regions 107. The mesa regions provide the direct contact are between the Schottky metal 110 and the n– GaN layer 106. Alternatively, each trench 108 can be covered by a metal instead of an insulator. In such variant, the Schottky metal is insulated and/or separated from the trench metal.

Figure 2B:
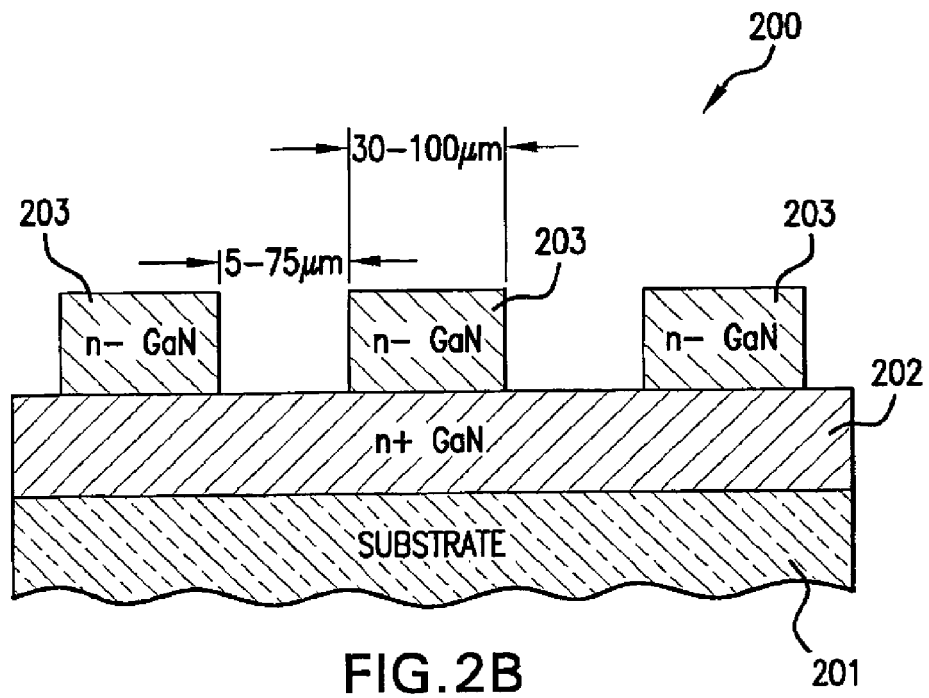
FIG. 2B is a highly simplified cross-sectional view of the GaN diode of FIG. 1B showing the periodic mesa structures.

FIG. 2B is a highly simplified cross-sectional view of the GaN diode of FIG. 1B showing a group of three of the periodic mesa structures according to the present invention to illustrate the range in width and spacing of the mesa "fingers" within the scope of the invention. More specifically, the width of each of the fingers 203 is selected to be from 30 to 200 microns, and the fingers 203 are spaced apart by 5 to 150 microns.

Figure 3:
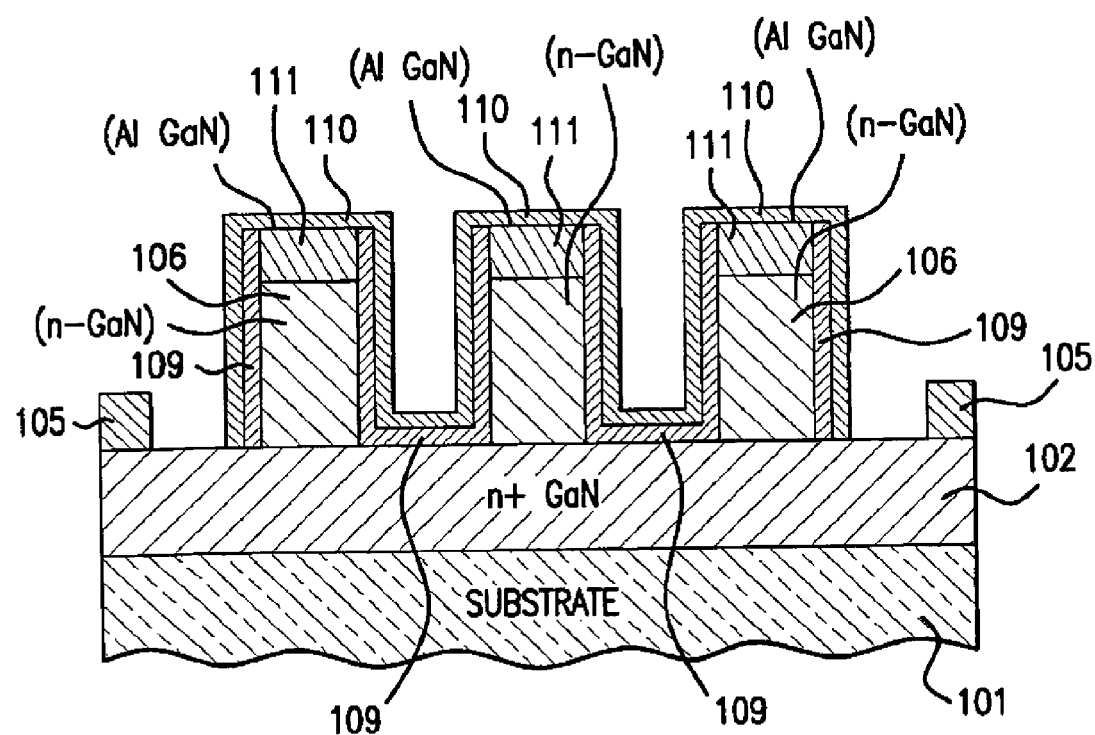
FIG. 3 is a highly simplified cross-sectional view of a GaN diode as known in the prior art in a third embodiment.

FIG. 3 is a highly simplified cross-sectional view of another GaN diode as known in the prior art in a third embodiment as depicted in US 2003/0062525; a trench structure to reduce reverse current. Like the Schottky diode depicted in FIG. 2A above, the trench structure separates a plurality of parallel equally spaced trenches, but in this embodiment, the top layers are etched through the AlGaN barrier layer 111 and completely through the n− GaN layer 106, to the n+ GaN layer 102. Similar mesa regions are formed between adjacent trenches. The trench sidewalls and bottom surface have an insulation layer 109 with the top Schottky metal layer 110 covering the entire trench structure. The trench structure functions in the same way as the embodiment of FIG. 2A above, reducing the reverse current.

Figure 4A:
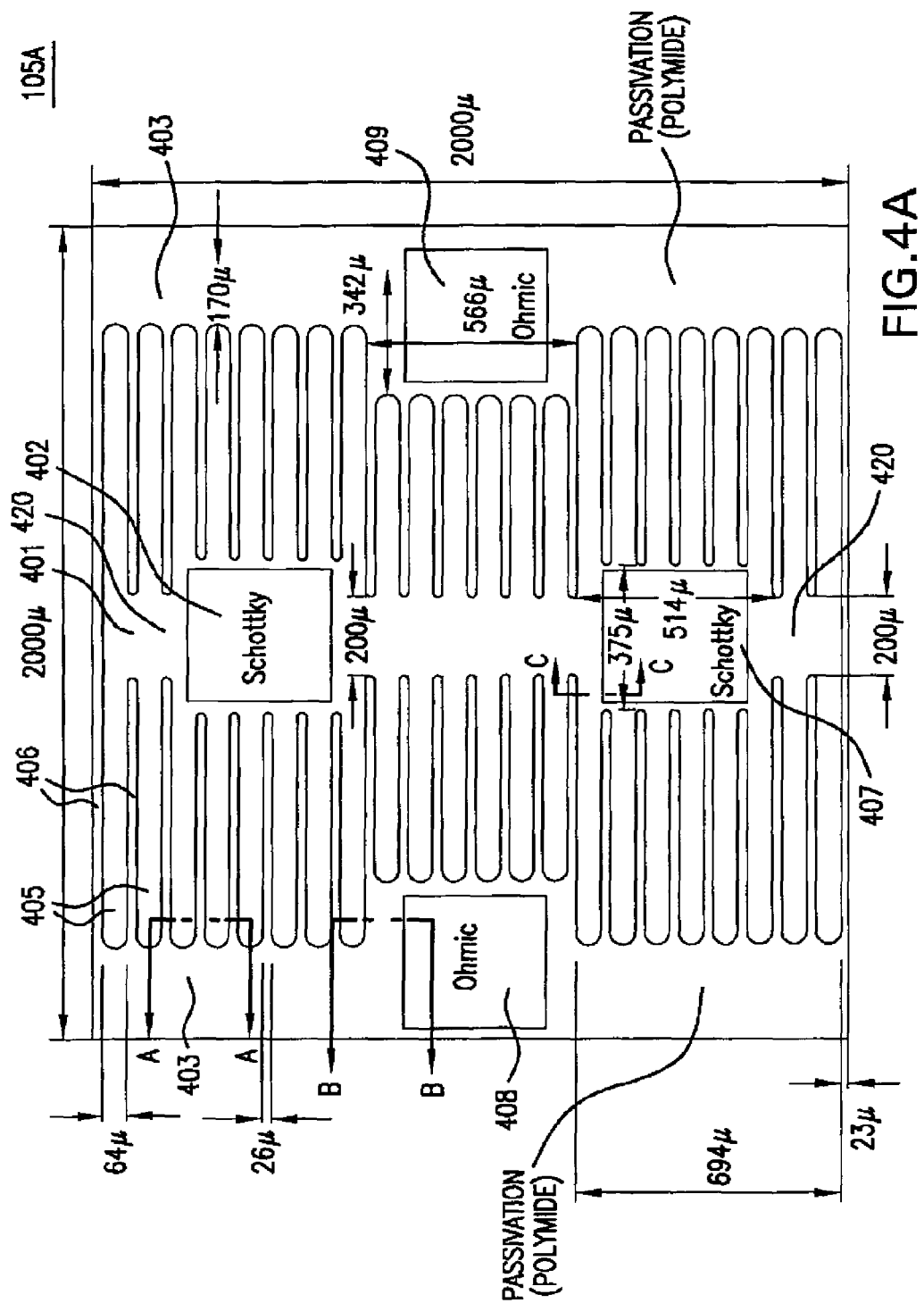
FIG. 4A is a top plan view of the GaN diode according to a first embodiment of the present invention.
Figure 4B:
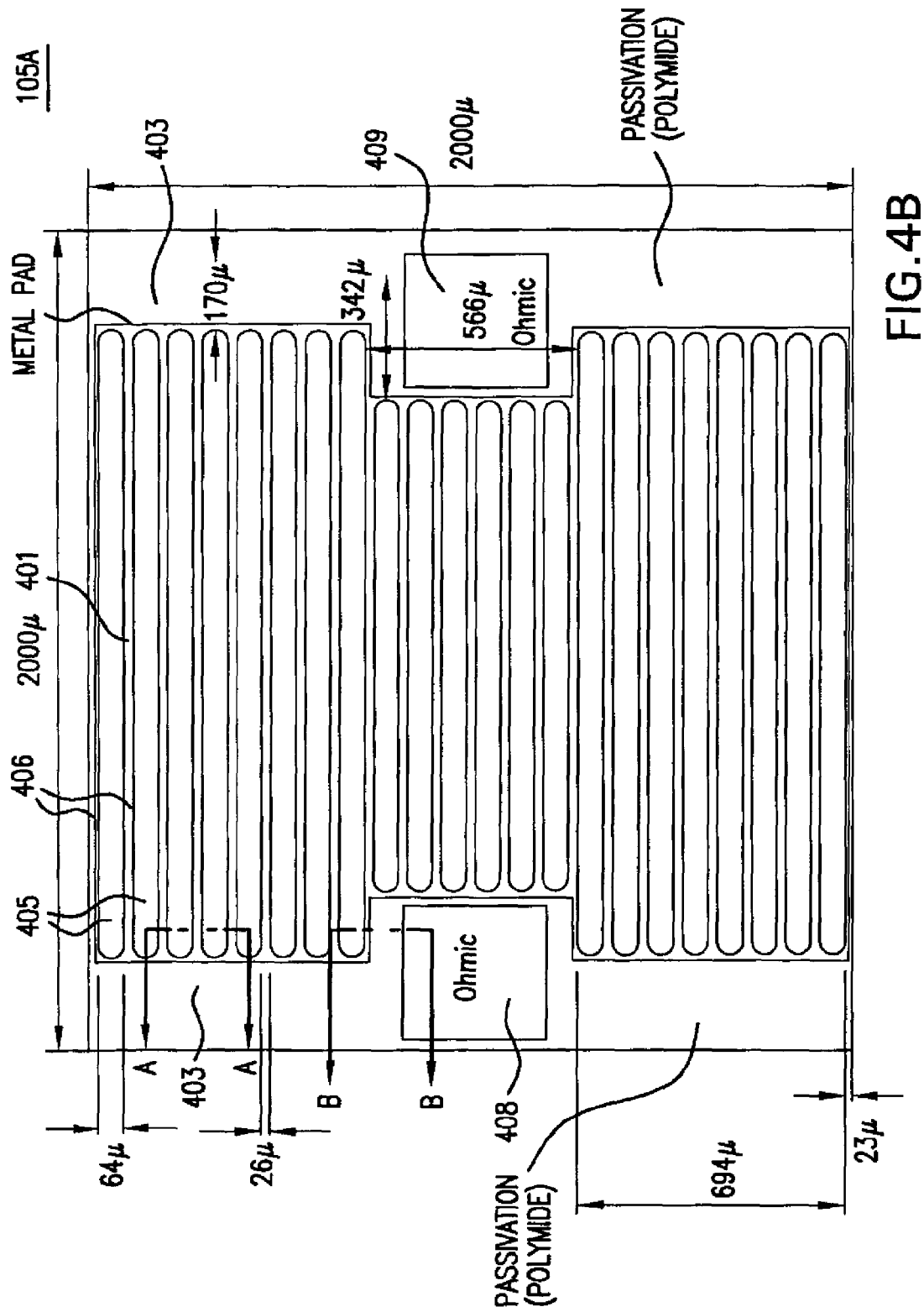
FIG. 4B is a top plan view of the GaN diode according to a second embodiment of the present invention.

FIGS. 4A and 4B are a top plan views of the GaN diode according to the present invention in respective first and second embodiments of the upper layers of the device which provide alternative designs for making contact with the ohmic and Schottky regions of the device.

More particularly, FIG. 4A is an enlarged top plan view of a first embodiment of the entire gallium nitride semiconductor device according to the present invention as implemented on a single die showing the Schottky 402, 407 and ohmic 408, 409 wire-bonding contact regions on the die. As will be seen by examining the fragmentary cross-sectional view of the device illustrated by FIG. 5A as seen through the A-A plane designated in FIG. 4A, the device is configured as a two level mesa structure in which a planar region 401 is at a higher level than planar region 403.

FIG. 4A depicts a linear central region 420, which is arranged vertically in the depiction of the device shown in FIG. 4A, which is common to all of the mesa fingers 405. The fingers 405 are preferably 64 microns in width and extend in parallel normal to and away from the central region 420 in both the left and the right directions. The fingers 405 are separated from each other by a distance of preferably 26 microns.

FIG. 4B is an enlarged top plan view of a second embodiment of the entire gallium nitride semiconductor device according to the present invention as implemented on a single die showing the ohmic 408, 409 wire-bonding contact regions on the die but utilizing a different approach to making the Schottky contacts that the approach used in FIG. 4A.

In particular, in the second embodiment a metal pad 410 extends over all of the mesa fingers and makes electrical contact with the Schottky metal. The metal pad 410 improves ability to wirebond larger diameter wires to the Schottky contact area when using relatively narrow and short device fingers. Additionally, the Schottky wirebond mesa pad areas shown in FIG. 4A can be completely removed from the center of the device as shown in FIG. 4B.

Figure 5A:
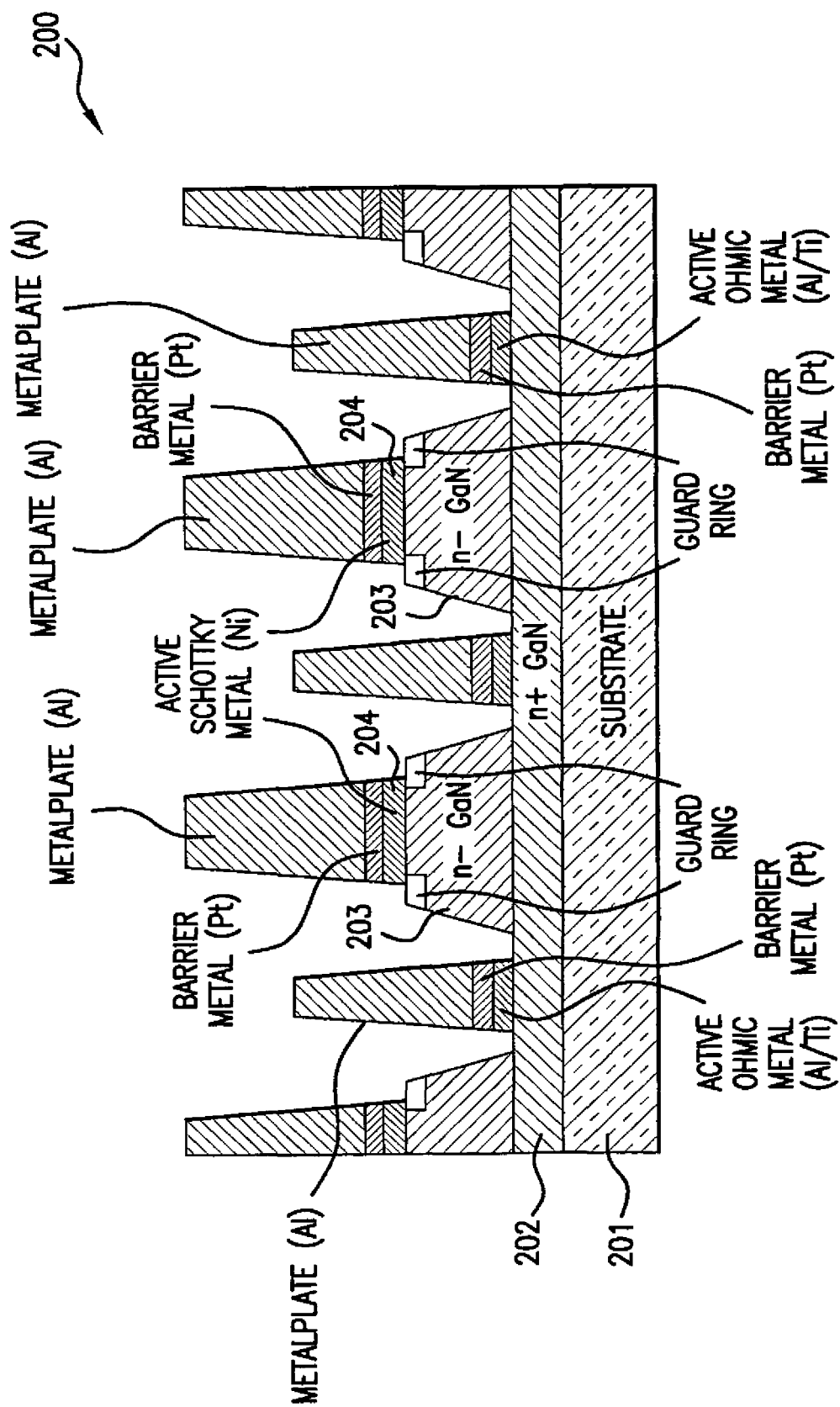
FIG. 5A is a detailed cross-sectional view of the GaN diode according to the present invention through the A-A plane of FIG. 4A or 4B showing the mesa structure during a stage of the fabrication process of the device.

FIG. 5A is a detailed cross-sectional view of the GaN diode according to the present invention through the A-A plane of FIG. 4A or FIG. 4B showing depicting the mesa structure in greater detail.

In particular, there is shown a sapphire substrate 201, a highly doped (n+) layer 202 of GaN deposited on the substrate, and a lightly doped (n−) layer of GaN 203 deposited over portions of the layer 202, as represented in the more simplified depiction of FIG. 2B described above. In the related U.S. patent application Ser. No. 10/780,526 filed Feb. 17, 2004, there is described the use of a low doped top layer for a GaN Schottky diode with modulation doping to get the desired doping level precisely.

There are several key aspects of the present invention to be described in connection with the representational view of FIG. 5A, first of which is the optimal mesa dimensions. These are based on the epilayer thickness and doping level of both main layers in the device. In view of the fact that the present invention uses a mesa structure, there are at least two conducting layers. The first is a low conducting layer that handles the voltage drop in reverse operation, while the second, or bottom layer, is high conductance and handles forward conduction such that a low operating voltage of the device is possible. The use of a mesa structure demands an appropriate design about how the current gets spread throughout the device. This is usually solved by designing a main mesa for providing a connection to the outside world (through the wires bonded to a bonding pad on the mesa) and a plurality of long and thin fingers in the mesa for current transport over the planar areas of the device. The dimensions of the fingers must be carefully designed. If the finger mesa is narrow, the current crowds at the edges of the finger and conduction is reduced. If the finger mesa is made wider, some areas of the device do not contribute to current transport and conductance is also reduced. Therefore an optimal width and length of the finger mesas exists for each epistructure grown. A complex model was used in the present invention to determine the width the finger mesas must be to overcome current crowding effects. This optimal width is determined simultaneously with the optimal length, since the two variables are related. The optimal width is dependent upon the mobility, thickness, doping level, and the depletion width of the top and bottom semiconductor layers. For the values used in a 6 micron n-type GaN layer, the present invention has determined that the optimal width is very slightly over 50 microns. This means that if the finger is significantly narrower than 50 microns current crowding effects will become dominant and the resistance will go up. This is therefore used as a lower limit for optimal device layout design. The finger length is optimized in a different fashion. If the finger is longer than a significant voltage drop will occur along the length of the fingers and therefore the driving force is reduced and resistance goes up. This can only be modeled by converting the fingers into networks of discrete resistances and optimized. For the case of a single finger, the optimal length is very close to 1600 microns. This value will change slightly, based on the desired total device area. The length of the fingers can be as short as 50 microns if an array of fingers is used in FIG. 4B. Finally, the finger separation determined by the n+ GaN layer sheet resistance and the ohmic contact resistivity, optimally 26 microns.

Another enhancement used in designing the mesa fingers and spacing is allowing the ohmic metal to go over the mesa step. This is done to reduce resistance of the device by essentially extending the ohmic metal to the edge of the mesa. The device robustness is increased because of the fact that aligning the areas to deposit the ohmic metals has much more tolerance due to the fact that if the ohmic metal covers the mesa but is still several (greater than 5 microns) away from the Schottky metal. This is an adequate distance to prevent the device from shorting between the ohmic and Schottky metals. It also ensures that all of the areas of the device between the mesas are covered by ohmic metals uniformly, which can be a problem in devices with very tall mesas. Additionally the etched mesa is coated with metal, reducing the possibility of arcing on the etched surface.

Figure 5B:
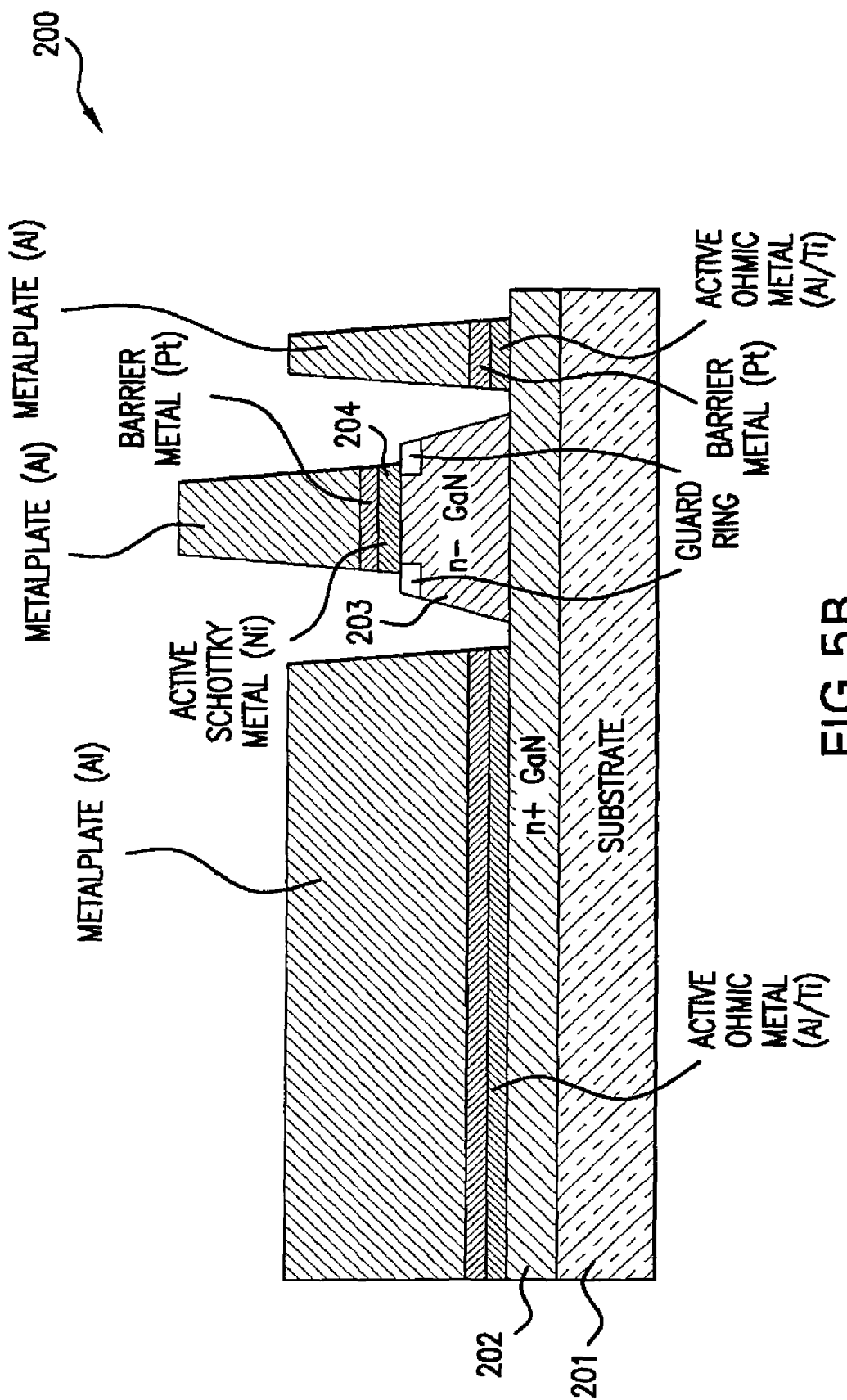
FIG. 5B is a detailed cross-sectional view of the GaN diode according to a first embodiment of the present invention in the B-B plane of FIG. 4A or 4B showing the ohmic bonding metal contact during the same stage of the fabrication process as depicted in FIG. 5A.

FIG. 5B is a detailed cross-sectional view of the GaN diode according to a first embodiment of the present invention in the B-B plane of FIG. 4A or 4B showing the ohmic bonding metal contact during the same stage of the fabrication process as depicted in FIG. 5A.

Figure 5C:
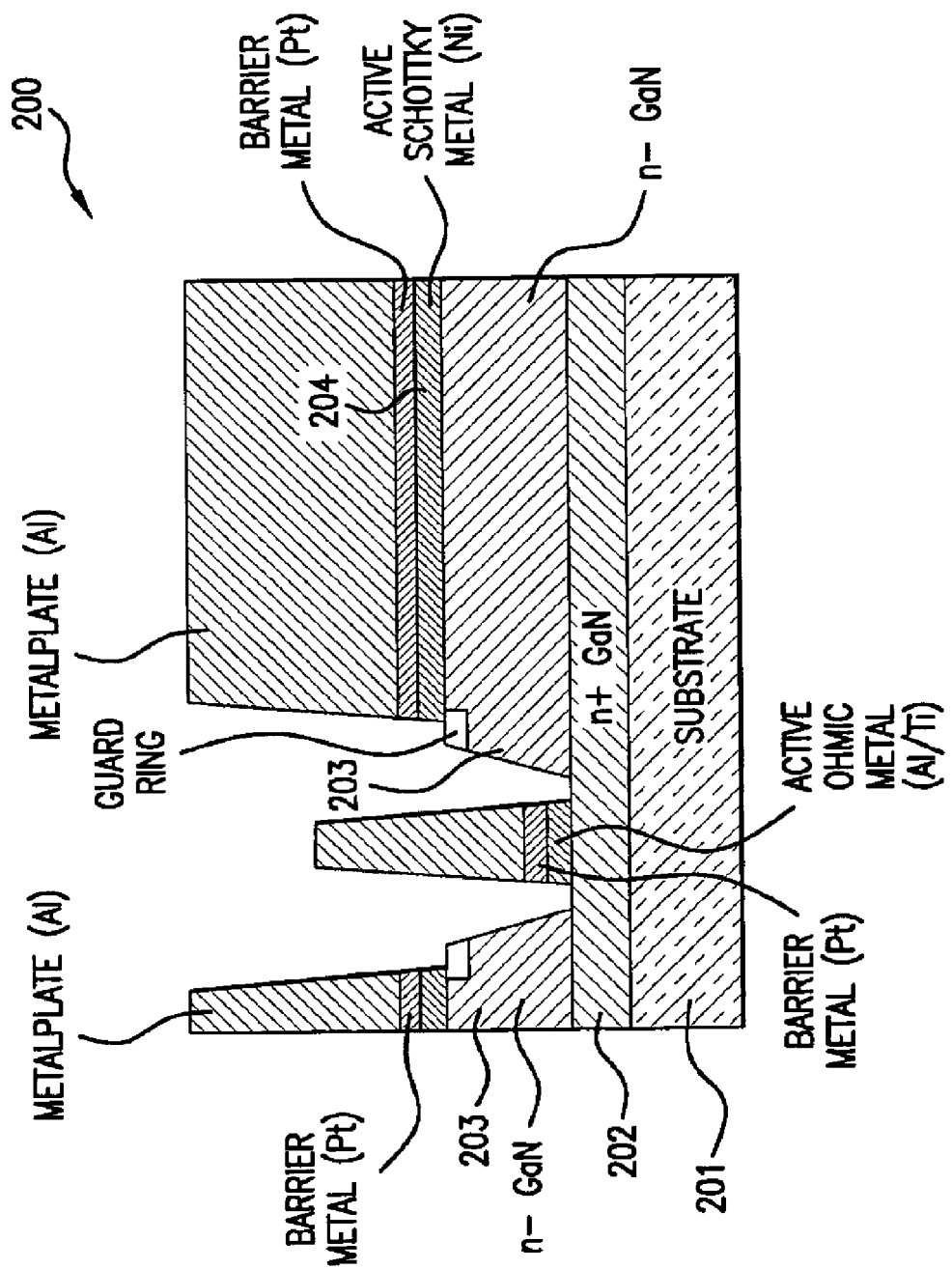
FIG. 5C is a detailed cross-sectional view of the GaN diode according to a first embodiment of the present invention through the C-C plane of FIG. 4A showing the Schottky bonding metal contacts during the same stage of the fabrication process as depicted in FIGS. 5A and 5B.

FIG. 5C is a detailed cross-sectional view of the GaN diode according to a first embodiment of the present invention through the C-C plane of FIG. 4A showing the Schottky bonding metal contacts during the same stage of the fabrication process as depicted in FIGS. 5A and 5B.

Figure 6A:
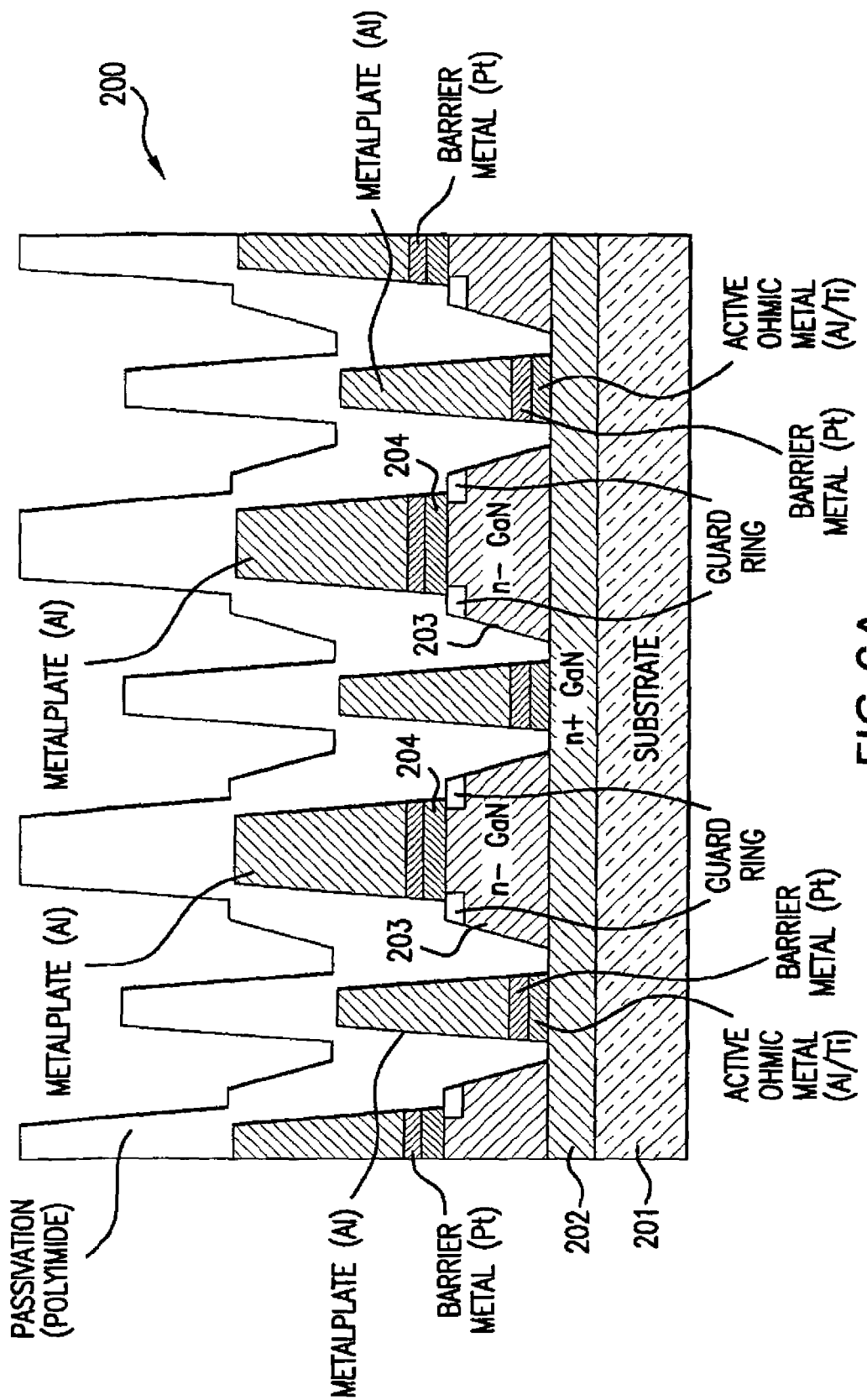
FIG. 6A is a detailed cross-sectional view of the GaN diode according the first embodiment of the present invention through the A-A plane of FIG. 4A showing the mesa structure after a subsequent stage in the fabrication process in which a passivation layer of silicon dioxide or polyimide is applied over the metal plate (Al) layer.

FIG. 6A is a detailed cross-sectional view of the GaN diode according the first embodiment of the present invention through the A-A plane of FIG. 4A showing the mesa structure after a subsequent stage in the fabrication process in which a passivation layer of silicon dioxide or polyimide is applied over the metal plate (Al) layer. This silicon dioxide may be deposited by sputtering, plasma-enhanced chemical vapor deposition (PECVD), or spin-on glass which are standard in the industry. The polyimide is a spin-on and cure coating similar to spin-on glass that has a very large dielectric constant and resists breakdown at high voltage.

Figure 6B:
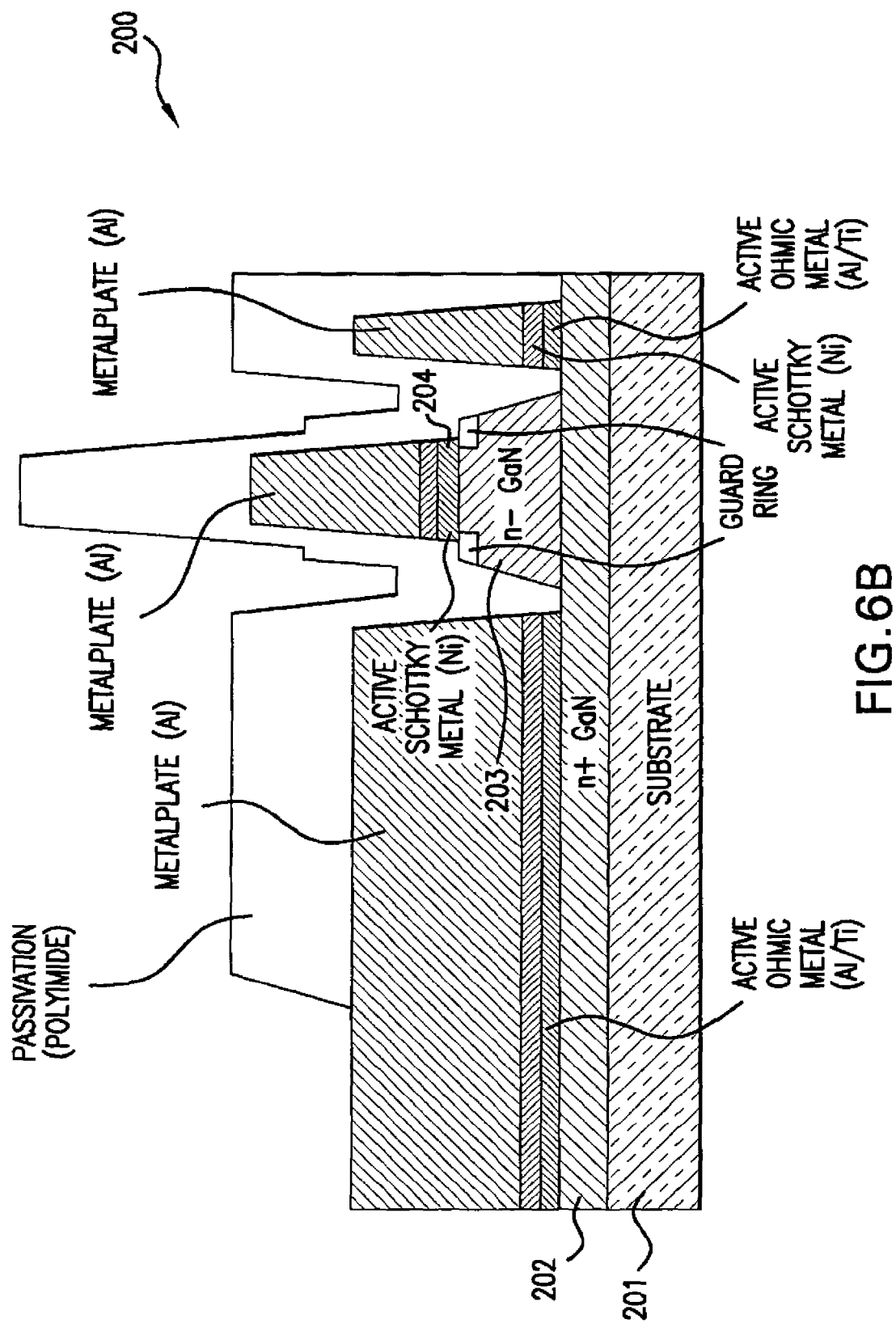
FIG. 6B is a detailed cross sectional view of the GaN diode according to a first embodiment of the present invention in the B-B plane of FIG. 4A showing the ohmic bonding metal contact during the same stage in the fabrication process as in FIG. 6A. The passivation layer covers the Schottky metal contacts, and the passivation layer is then patterned to expose a contact to the active ohmic metal.

FIG. 6B is a detailed cross sectional view of the GaN diode according to a first embodiment of the present invention in the B-B plane of FIG. 4A showing the ohmic bonding metal contact during the same stage in the fabrication process as in FIG. 6A. The passivation layer covers the Schottky metal contacts, and the passivation layer is then patterned to expose a contact bondpad to the active ohmic metal, or cathode.

Figure 6C:
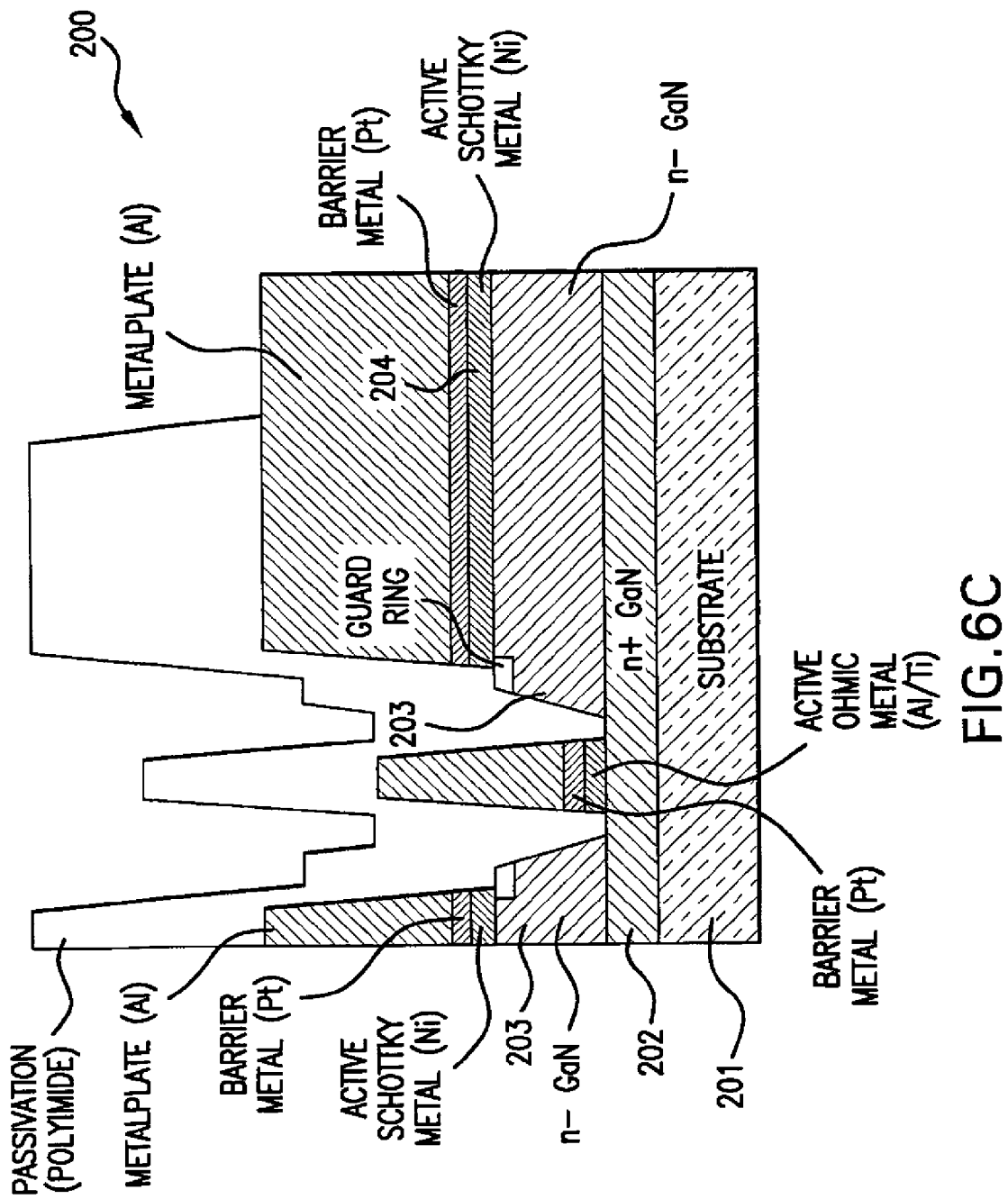
FIG. 6C is a detailed cross sectional view of the GaN diode according to a first embodiment of the present invention through C-C plane of FIG. 4A showing the Schottky bonding metal contacts during the same stage in the fabrication process as in FIGS. 6A and 6B.

FIG. 6C is a detailed cross sectional view of the GaN diode according to a first embodiment of the present invention through C-C plane of FIG. 4A showing the Schottky bonding metal contacts during the same stage in the fabrication process as in FIGS. 6A and 6B, with the bondpad opening to active Schottky metal for the anode.

Figure 7A:
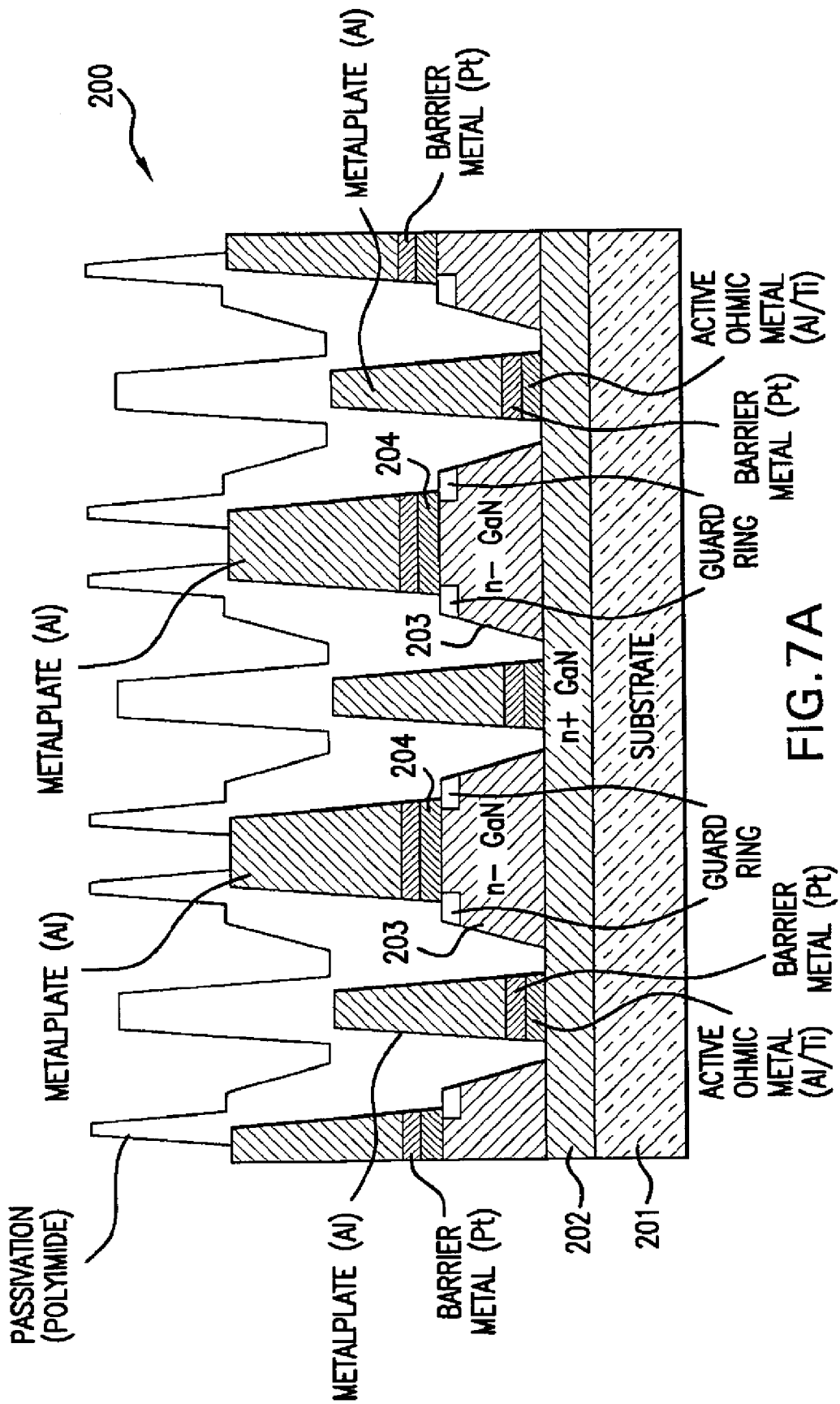
FIG. 7A is a detailed cross sectional view of the GaN diode according the second embodiment of the present invention through the A-A plane of FIG. 4B showing the mesa structure after a subsequent stage in the fabrication process.

FIG. 7A is a detailed cross sectional view of the GaN diode according the second embodiment of the present invention through the A-A plane of FIG. 4B showing the mesa structure after a subsequent stage in the fabrication process. In this stage, the passivation layer completely covers the layer structure to prevent arcing of the high electric field that exists in the device. This protection is necessary to provide reliable device operation over an extended period of time. This layer also allows for bonding pad areas to be created so that the wirebonds are placed on the device in a clearly defined location and the wirebonds do not interfere with the operation of the device.

Figure 7B:
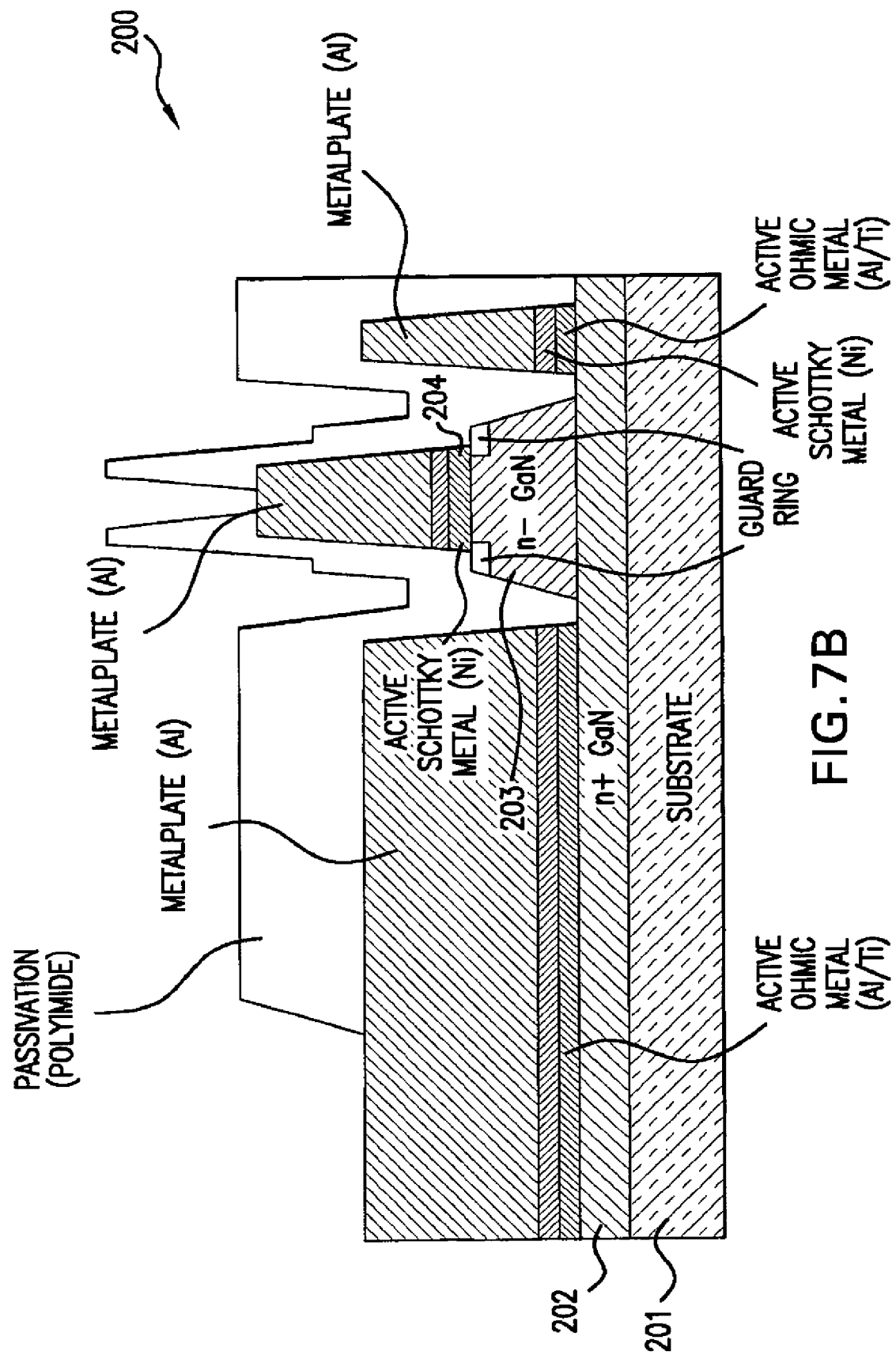
FIG. 7B is a detailed cross-sectional view of the GaN diode according to the second embodiment of the present invention through the B-B plane of FIG. 4B showing the ohmic bonding metal contact during the same stage in the fabrication process as in FIG. 7A.

FIG. 7B is a detailed cross-sectional view of the GaN diode according to the second embodiment of the present invention through the B-B plane of FIG. 4B showing the ohmic bonding metal contact during the same stage in the fabrication process as in FIG. 7A.

Figure 8A:
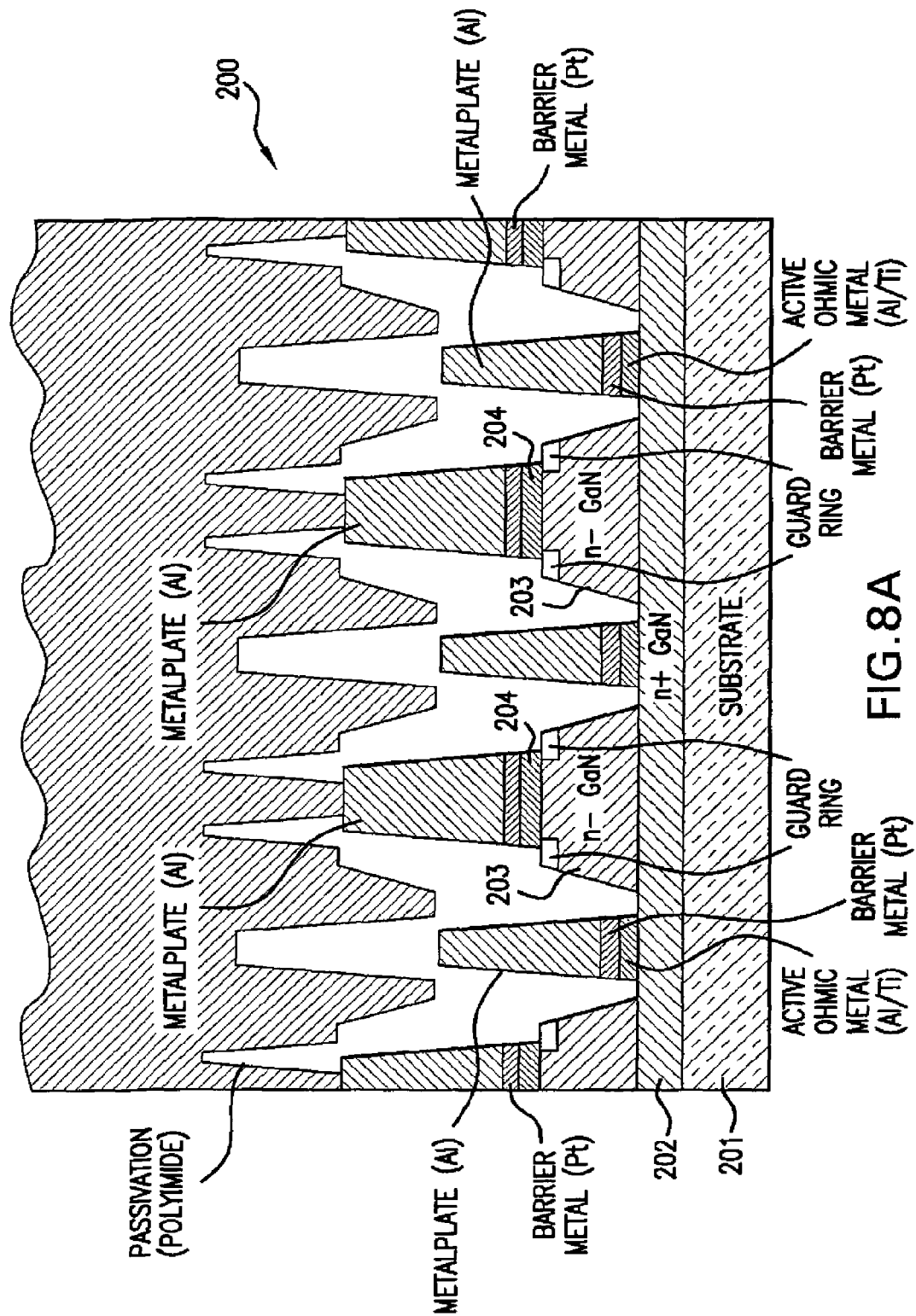
FIG. 8A is a detailed cross-sectional view of the GaN diode according the first embodiment of the present invention through the A-A plane of FIG. 4B showing the mesa structure after a subsequent stage in the fabrication process following that of FIG. 7A.

FIG. 8A is a detailed cross-sectional view of the GaN diode according the first embodiment of the present invention through the A-A plane of FIG. 4B showing the mesa structure after a subsequent stage in the fabrication process following that of FIG. 7A. This stage of the fabrication is done in order to provide a large metal pad area for a flip-chip configuration of the die. In this case, a larger metal contact than just a bonding pad is applied to allow for the large solder or epoxy connection as described in the U.S. patent application Ser. No. 11/032,666 filed Jan. 10, 2005, entitled, patent application "PACKAGE FOR GALLIUM NITRIDE SEMICONDUCTOR DEVICES", filed concurrently herewith.

Figure 8B:
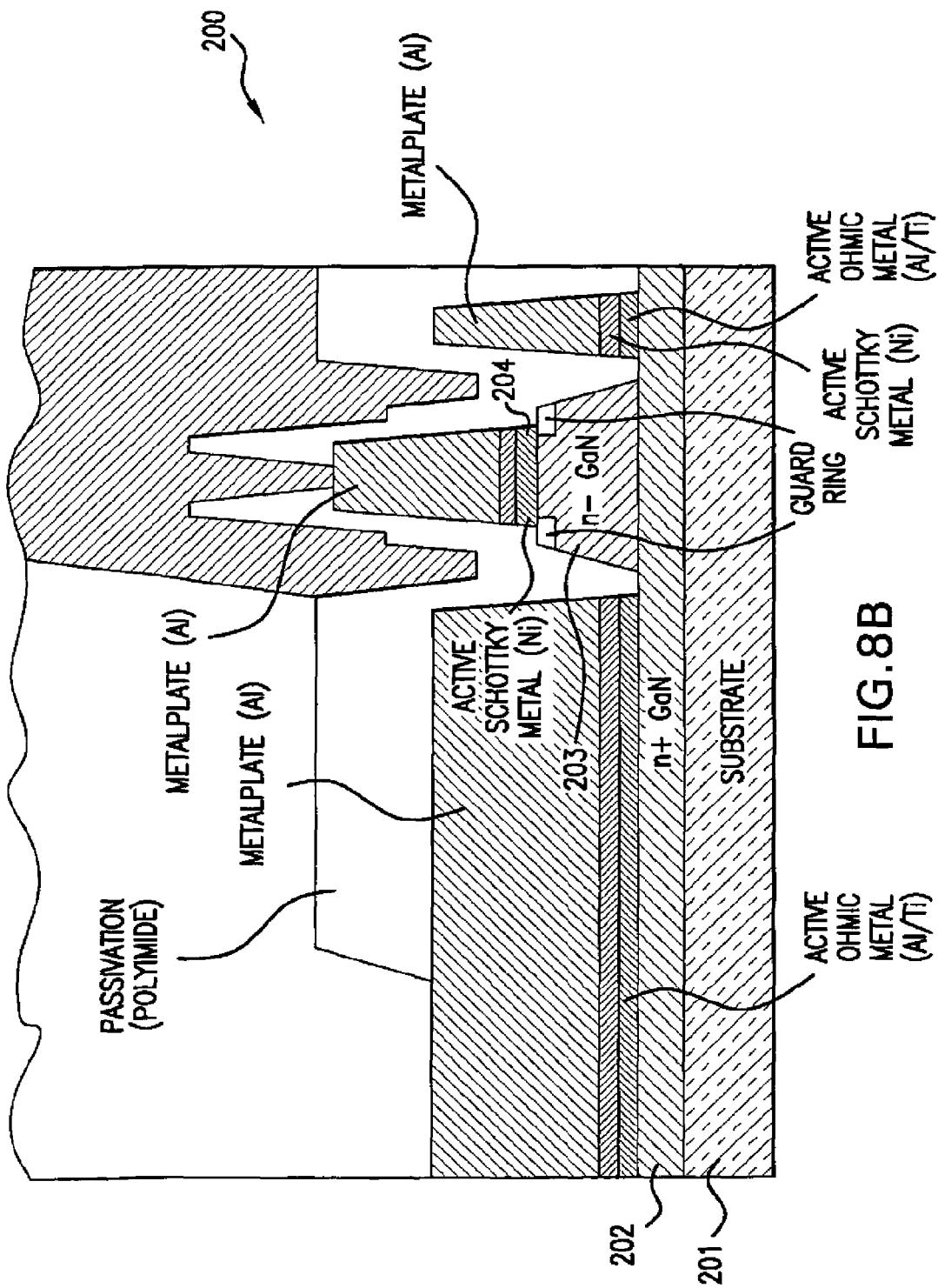
FIG. 8B is a detailed cross-sectional view of the GaN diode according to the first embodiment of the present invention through the B-B plane of FIG. 4B showing the deposition of the Schottky bonding metal contact during the same stage in the fabrication process as in FIG. 8A.

FIG. 8B is a detailed cross-sectional view of the GaN diode according to the first embodiment of the present invention through the B-B plane of FIG. 4B showing the deposition of the Schottky bonding metal contact during the same stage in the fabrication process as in FIG. 8A.

In the related U.S. patent application Ser. No. 10/935,000, filed Sep. 7, 2004, there is described the use of a resistive guard ring is shown. In that application, there is described two methods of making the guard ring: one was self-aligned guard ring where the Schottky metal and ohmic metal acted as a guard ring mask and the second where a Schottky metal was deposited to overlap a pre-existing guard ring. These two techniques may be applied but the present invention teaches a third variation by using the self-aligned process but then depositing a second Schottky metal to achieve an overlap of the first, for a double Schottky process. The two metals may be different such as to provide good forward current conduction, but high reverse voltage protection on the edge of the resulting metal structure. This double Schottky process provides all of the advantages of increased alignment tolerance offered with the self-aligned guard ring with the added flexibility of a higher work function metal for edge termination.

The conventional process of GaN Schottky diode fabrication starts with the implantation process, followed by a Schottky contact that must be properly aligned to have an overlapped region on the implantation region. This is the requirement of edge termination as described above. However, since the GaN Schottky diode is preferably grown on a sapphire substrate, and it requires lateral current conduction, it restricts the tolerance for misalignment of Schottky contact to implanted region.

The second Schottky metal process of the present invention takes all of the advantage of the self-aligned implantation. The implantation region under the second Schottky contact edge is to sustain the high electric field originated from the field crowding effect. This approach has another substantial benefit to the device performance, since the device leakage current exponentially decreases as the barrier height of the second Schottky contact increases. However, the increased barrier height will also cause a higher forward voltage drop, which is not desirable feature in the GaN Schottky device operation. By using Ni metal (with a lower barrier height) as the first Schottky metal and Pt which has higher work function (meaning forms higher barrier height) as a second Schottky metal, the leakage current is reduced because the most leakage current occurs at the field crowded metal edge. In the forward conduction mode, the current conduction is through the center of the Ni Schottky contact, and the forward voltage is lower than it would be if the entire Schottky contact were Pt. Thus this double Schottky metal approach is expected to improve the device forward performance without sacrificing the reverse characteristics of the device.

Another aspect of the invention relates to the Schottky diode metal layers 204 depicted in FIG. 5A through 5C. A low work function metal, such as Ti, Al, Ag, is used on the top of Schottky metal stack 204 to reduce the device resistance. The device performance may degrade, if the low work function metal comes in contact with the n– GaN layer surface, when the device experiences an increased temperature ambient. Two methods are proposed to solve this issue and protect the n– GaN layer from possible degradation; the use of two separate metal deposition steps of slightly difference size or the use of a step dielectric under the Schottky metal stack.

Figure 9A:
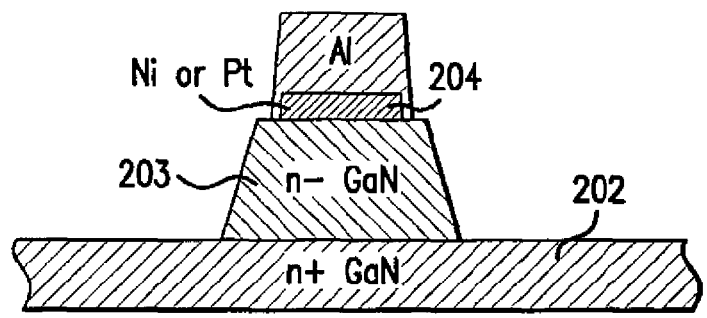
FIG. 9A is an enlarged cross-sectional of the Schottky contact portion of the GaN diode according to the present invention.
Figure 9B:
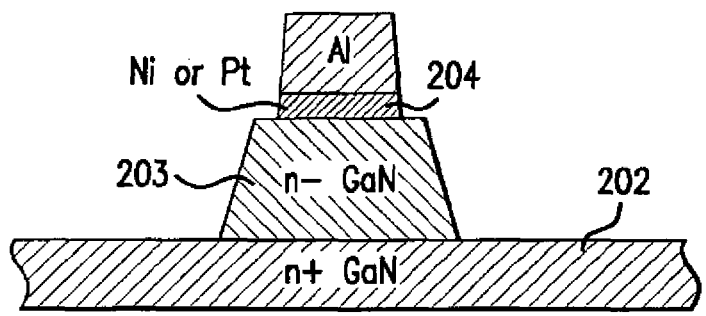
FIG. 9B is an enlarged cross-sectional of the Schottky contact portion of the GaN diode according to the present invention.

FIG. 9B is an enlarged cross-sectional of the Schottky contact portion of the GaN diode according to the present invention in which the metal layers of FIG. 9B are deposited simultaneously and thus are of the same size.

FIG. 9A is an enlarged cross-sectional of the Schottky contact portion of the GaN diode according to the present invention which indicates a low work function metal (in this case Al) which is deposited separately and it is slightly larger than the initial Schottky contact of a high work function metal. As described above, the contact configuration of FIGS. 9A and 9B may cause the device performance to degrade.

Figure 9C:
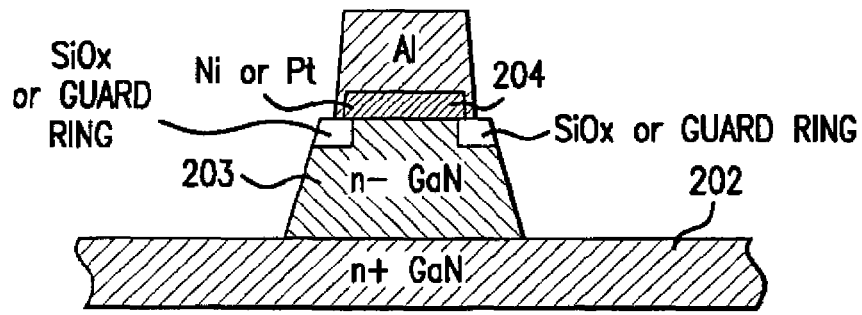
FIG. 9C is an enlarged cross-sectional of the Schottky contact portion of the GaN diode according to the present invention.

FIG. 9C is an enlarged cross-sectional of the Schottky contact portion of the GaN diode according to the present invention. In this case, a guard ring is first placed selectively on the surface of the n– GaN layer. In this regard, the low work function metal does not touch the n– GaN layer, allowing for improved device performance.

Figure 9D:
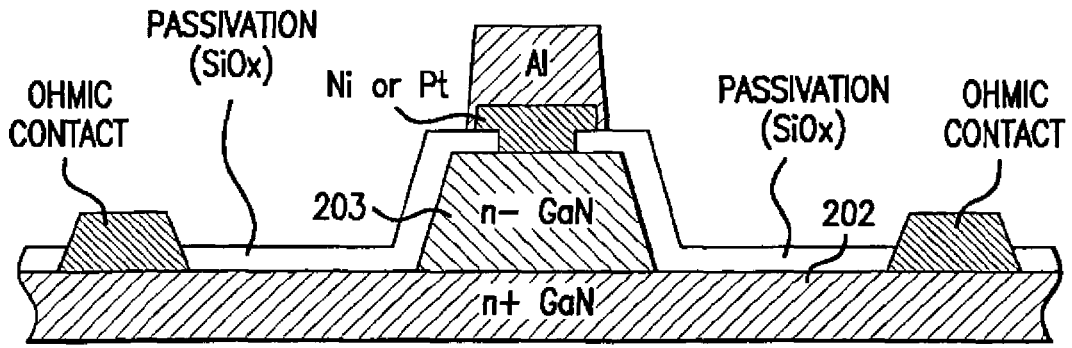
FIG. 9D is an enlarged cross-sectional of the Schottky contact portion of the GaN diode according to another embodiment of the present invention.

FIG. 9D is an enlarged cross-sectional of the Schottky contact portion of the GaN diode according to the present invention. In this case, a passivation layer is first placed selectively on the surface of the n– GaN layer and n+ GaN layer to protect the active device surface from damage or contamination. This is commonly referred to as a field plate design. In this regard, the low work function metal does not touch the n– GaN layer, allowing for improved device performance.

Large work function metals, such as Ni and Pt, are preferred as Schottky contact metal in GaN Schottky diode, although other high work function metals and suicides may also be used such as Au, Co, Pd, Mo, Cr, Rh, Re, PtSi and NiSi. To conduct high current (greater than four amperes) in the forward conduction mode, a certain minimum thickness of the Schottky metal is necessary. However, since Ni and Pt are high refractory metals, it is not practical to deposit thick layers of Ni or Pt by electron beam evaporation. The simple and efficient solution is using multiple metal stacks, which contains first deposited Schottky metal (preferably Ni) followed by a barrier metal (preferably Pt or Au) and finally a high conducting metal (preferably Al). Al is the immediate choice for this highly conducting metal since it has the following advantages: 1) Al has very low electrical resistance, 2) it is compatible with package requirements, and 3) the deposition is easy and cost efficient. The only flaw in this multiple metal stack approach is if these metals are deposited simultaneously, the diode performance degrades at elevated temperature. It constitutes a severe failure mode for the device operation because GaN Schottky should operate under increased temperature (as high as 175.degree. C.-300.degree. C.) without permanent degradation of the performance. In practice, the Schottky metal stack formed on the top of the GaN in FIG. 5A may be formed in two deposition steps of slightly different size. In the preferred embodiment of multiple metal stacks, Ni/Au is deposited in the thicknesses of 2000.ANG./10000 ANG. as a first metal stack and Ni/Ti/Al is deposited in the thicknesses of 2000.ANG./500.ANG./32000.ANG. in a second stack. Pt may also be used for the Ni or Ti, though it is more difficult to deposit thicker layers of Pt so it is not preferred.

FIG. 9D is an enlarged cross-sectional of the Schottky contact portion of the GaN diode according to the present invention. In this case, a passivation layer is first placed entirely over the n– GaN mesa structures and the n+ GaN surface. Openings are then made for contacts to the n– GaN mesa structures and the n+ GaN surface, and the ohmic contact and Schottky contact layers are deposited in a manner as previously described. Again as in FIG. 9C, the low work function metal does not touch the n– GaN layer, allowing for improved device performance.

The use a dielectric film such as silicon dioxide, silicon nitride or aluminum oxide before depositing the multiple Schottky metal stack is illustrated in FIG. 9D. In this situation, only the first Schottky metal layer will contact the n-type GaN layer surface. The Al will be isolated from GaN surface by a layer of dielectric with certain thickness. Experimental results show that the GaN Schottky device performance is not degraded even experiencing the test under 300.degree. C. ambient. With this approach, we can apply this simple and cost efficient multiple metal stack as the Schottky contact. The use of this dielectric layer is considered a field plate for Schottky diodes, and can also improve the device performance when used alone or in conjunction with a guard ring. By varying the thickness of this dielectric layer, the high electric fields on the edge of the Schottky metal can be decreased.

Still another aspect of the invention relates to the use of alternative materials for the top layer of the GaN Schottky diode.

Most nitride-based Schottky diodes are GaN-based devices. In such devices, a Schottky metal contact is formed on one GaN surface of a GaN structure, and an ohmic metal contact is formed on another layer of the GaN device. Typically, the Schottky contact is formed on the lower doped n-type layer, and the ohmic contact is formed on the high n+ GaN layer.

The present invention provides a Schottky diode with an AlGaN top layer either instead of or in addition to the GaN top layer on which the Schottky contact is formed. As used in the present disclosure, the term "AlGaN semiconductor layer" refers to a compound semiconductor material according to the stochiometric formula Al.sub.xGa.sub.(1–x)N, where x is from 0 to 1, including 0 and 1. The AlGaN layer may be undoped or n-type doped with a doing concentration from 1.times. 10.sup.14 to 2.times.10.sup.16 per cm.sup.3.

The rectifying properties of the metal-to-doped semiconductor junction results from a contact potential difference that is based on the difference that is based on the difference in the respective work functions of the contacting metallic layer and semiconductor body as well as on the semiconductor surface states. When the device is reverse biased, a small amount of leakage current flows in the reverse direction. When the reverse bias voltage is sufficiently high, the high field concentration increases and may result in avalanche breakdown in the device.

Utilizing the AlGaN layer in the diode structure, we can expect higher breakdown voltage when compared to the GaN diode. The accurate breakdown voltage for AlGaN can be calculated by using the expression for ionization coefficients, as was calculated for GaN materials. The good approximation, suggested by T. P. Chow, is that critical field scales as the square of bandgap. Using this approximation, and Vegard's law, one can estimate critical fields for defined Al concentration: F.sub.cr.sup.AlGaN=(E.sub.g.sup.AlGaN).sup.2/E.sub.cr.sup.GaN Presently, AlGaN Schottky diodes are lateral conduction devices. In this invention the AlGaN structure resides on a mesa structure. In the mesa structures at least one region of the semiconductor layer may be patterned and etched prior to forming the metallic contact to define at least one lower contact surface in the semiconductor body and at least one mesa where the mesa projects upwardly from the further surface. Typically, the lower surface is the location of the ohmic contact, whereas the upper one is the location of the Schottky contact.

It will be understood that each of the elements described above, or two or more together, also may find a useful application in other types of constructions differing from the types described above.

While the invention has been illustrated and described as embodied in a gallium nitride semiconductor device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and; therefore, such adaptations should and are intended to be comprehended within the meaning a range of equivalence of the following claims.

The invention claimed is:

1. A method for fabricating a gallium based semiconductor diode, comprising:
   providing a substrate;
   forming an n+ doped GaN layer having a thickness between one and six microns on said substrate;
   forming an n– GaN layer having a thickness greater than three microns on said n+ GaN layer;
   depositing a first metal layer on said n– doped GaN layer so as to form a first Schottky junction therewith, resulting in said diode having a forward voltage of less than two volts with a current capacity of at least four amperes; and
   patterning said n– doped layer into a sequence of parallel, elongated finger regions extending normally from a common central region in opposite directions.

2. The method as defined in claim 1, further comprising depositing an ohmic metal layer over at least a portion of the n+ GaN layer so as to make ohmic contact with said n+ GaN layer and to form a contact bonding surface of the device.

3. The method of claim 2 wherein said ohmic metal layer is deposited over said finger regions.

4. The method of claim 1 wherein said finger regions provide for current transport within said diode.

5. The method as defined in claim 1, wherein the width of each finger regions is approximately 50 microns and spacing between 5 and 150 microns so that the resulting diode has a breakdown voltage greater than 500V.

6. The method as defined in claim 1, wherein the width of each finger regions is approximately 50 microns and spacing between 5 and 150 microns so that the resulting diode has a breakdown voltage between 200 and 500 volts.

7. The method as defined in claim 1, further comprising depositing an aluminum contact layer over the first metal layer and extending over each of the finger regions so as to form a large, low resistance contact binding surface of the device.

8. The method as defined in claim 7 wherein said aluminum contact layer and said first metal layer are deposited simultaneously and are substantially of the same size.

9. The method as defined in claim 7 wherein said aluminum contact layer is substantially larger in size than the first metal layer.

10. The method of claim 9 wherein said first and second metal layers include one of the metals selected from the group comprising Ni, Pt, Au, Co Pd, Mo, Cr Rh, Re, PtSi and NiSi.

11. The method as defined in claim 1 further comprising thinning the substrate to a thickness less than 10 mils to reduce thermal resistance of the substrate for device heat dissipation.

12. The method as defined in claim 1, further comprising depositing an AlGaN layer between said n-doped GaN layer and said first metal layer.

13. The method as defined in claim 1 further comprising depositing a second metal layer on said n– doped GaN layer so as to form a second Schottky junction.

14. The method of claim 1 further comprising placing a guard ring selectively on surface of said n– GaN layer.

15. The method of claim 1 further comprising placing a passivation layer selectively on surface of said n– GaN layer and on surface of said n+ GaN layer.

16. The method of claim 15 wherein said passivation layer covers the Schottky junction.

17. The method of claim 15 further comprising patterning said passivation layer to create bonding pad regions.

18. The method of claim 1 further comprising placing a passivation layer entirely over the n– GaN layer and the n+ GaN layer.

* * * * *